United States Patent
Song et al.

(10) Patent No.: US 9,260,309 B2
(45) Date of Patent: Feb. 16, 2016

(54) METHOD AND APPARATUS FOR MANUFACTURING GRAPHENE

(75) Inventors: Young-Il Song, Changwon (KR); Hyeong-Keun Kim, Changwon (KR); Byung-Hee Hong, Changwon (KR); Jong-Hyun Ahn, Changwon (KR)

(73) Assignees: RESEARCH & BUSINESS FOUNDATIION SUNGKYUNKWAN UNIVERSITY, Suwon-si (KR); Hanwha Techwin Co., Ltd., Changwon-si (KR)

( * ) Notice: Subject to any disclaimer, the term of this patent is extended or adjusted under 35 U.S.C. 154(b) by 135 days.

(21) Appl. No.: 13/982,880

(22) PCT Filed: Jan. 30, 2012

(86) PCT No.: PCT/KR2012/000690
§ 371 (c)(1),
(2), (4) Date: Oct. 7, 2013

(87) PCT Pub. No.: WO2012/105777
PCT Pub. Date: Aug. 9, 2012

(65) Prior Publication Data
US 2014/0017160 A1  Jan. 16, 2014

(30) Foreign Application Priority Data

Jan. 31, 2011 (KR) ........................ 10-2011-0009498
Dec. 28, 2011 (KR) ........................ 10-2011-0144978

(51) Int. Cl.
*C01B 31/04* (2006.01)
*C23C 16/26* (2006.01)
(Continued)

(52) U.S. Cl.
CPC ............. *C01B 31/0453* (2013.01); *B82Y 30/00* (2013.01); *B82Y 40/00* (2013.01); *C23C 16/26* (2013.01); *C23C 16/4582* (2013.01); *C23C 16/545* (2013.01)

(58) Field of Classification Search
CPC   C01B 31/04; C01B 31/0407; C01B 31/0415; C01B 2204/00; C01B 2204/02; C01B 2204/04; C01B 2204/06; C01B 2204/065; C01B 2204/20; C01B 2204/22; C01B 2204/24; C01B 2204/28; C01B 2204/30; C01B 2204/32
USPC .......................................... 423/448; 422/218
See application file for complete search history.

(56) References Cited

U.S. PATENT DOCUMENTS

| | | | |
|---|---|---|---|
| 6,350,488 B1 * | 2/2002 | Lee et al. | .................... 427/249.1 |
| 2006/0073275 A1 | 4/2006 | Maruyama et al. | |

(Continued)

FOREIGN PATENT DOCUMENTS

| | | |
|---|---|---|
| CN | 1282801 A | 2/2001 |
| CN | 101423209 A | 5/2009 |

(Continued)

OTHER PUBLICATIONS

Communication dated Sep. 24, 2014 issued by the State Intellectual Property Office of People's Republic of China in counterpart Chinese Application No. 201280016553.5.
(Continued)

*Primary Examiner* — Daniel C McCracken
(74) *Attorney, Agent, or Firm* — Sughrue Mion, PLLC

(57) ABSTRACT

A method and an apparatus for synthesizing graphene. The method includes loading catalyst metals into a chamber in the horizontal direction or the vertical direction; increasing sizes of grains of the catalyst metals by heating the catalyst metals; raising a temperature inside the chamber while providing a vapor carbon source in the catalyst metals; and forming graphene by cooling the catalyst metals.

6 Claims, 9 Drawing Sheets

(51) Int. Cl.
*C23C 16/458* (2006.01)
*C23C 16/54* (2006.01)
*B82Y 30/00* (2011.01)
*B82Y 40/00* (2011.01)

(56) References Cited

U.S. PATENT DOCUMENTS

| | | | |
|---|---|---|---|
| 2009/0068471 A1 | 3/2009 | Choi et al. | |
| 2009/0110627 A1 | 4/2009 | Choi et al. | |
| 2009/0155561 A1 | 6/2009 | Choi et al. | |
| 2012/0132353 A1* | 5/2012 | Hauck | B82Y 30/00 156/272.8 |

FOREIGN PATENT DOCUMENTS

| | | |
|---|---|---|
| CN | 101835609 A | 9/2010 |
| CN | 102249221 A | 11/2011 |
| CN | 102275858 A | 12/2011 |
| EP | 1072693 A1 | 1/2001 |
| EP | 2055673 A1 | 5/2009 |
| WO | 2008153609 A1 | 12/2008 |
| WO | 2011/046415 A2 | 4/2011 |

OTHER PUBLICATIONS

International Search Report (PCT/ISA/210) dated Aug. 22, 2012, issued in International Application No. PCT/KR2012/000690.
Written Opinion (PCT/ISA/237) dated Aug. 22, 2012, issued in International Application No. PCT/KR2012/000690.

* cited by examiner (a)

(b)

(a)  (b)

METHOD AND APPARATUS FOR MANUFACTURING GRAPHENE

TECHNICAL FIELD

One or more embodiments of the present invention relate to methods and apparatuses for synthesizing graphene that may be used for manufacturing graphene.

BACKGROUND ART

Currently, carbon-based materials, such as carbon nanotubes, diamond, graphite, and graphene, are being researched in various fields.

From among those materials, carbon nanotubes have been prominent since the 1990s. However, graphene having plate-like structures is being focused on lately. Graphene is a several nm thick thin-film in which carbon atoms are 2-dimensionally arranged and charges function as zero effective mass particles. Therefore, graphene has high electric conductivity, high thermal conductivity, and high elasticity.

Therefore, ever since graphene had been introduced, various research has been conducted into characteristics of graphene and the utilization of graphene in various fields. Due to high electric conductivity and high elasticity, graphene is suitable to be applied to transparent and flexible devices.

DISCLOSURE OF INVENTION

Technical Problem

One or more embodiments of the present invention include a method and an apparatus for synthesizing a large quantity of fine-quality graphene.

Solution to Problem

Additional aspects will be set forth in part in the description which follows and, in part, will be apparent from the description, or may be learned by practice of the presented embodiments.

According to one or more embodiments of the present invention, a method of synthesizing graphene, the method comprises loading catalyst metals into a chamber in the horizontal direction or the vertical direction; increasing sizes of grains of the catalyst metals by heating the catalyst metals; raising a temperature inside the chamber while providing a vapor carbon source in the catalyst metals; and forming graphene by cooling the catalyst metals.

A size of a grain of the catalyst metal may be greater than 100 μm.

The catalyst metal may contain one or more selected from the group consisting of nickel (Ni), cobalt (Co), iron (Fe), platinum (Pt), gold (Au), aluminum (Al), chrome (Cr), copper (Cu), magnesium (Mg), manganese (Mn), molybdenum (Mo), rhodium (Rh), silicon (Si), tantalum (Ta), titanium (Ti), and tungsten (W).

The step of raising the temperature inside the chamber while providing a vapor carbon source in the catalyst metals may comprise thermal chemical vapor deposition (T-CVD), rapid thermal chemical vapor deposition (RT-CVD), inductive coupled plasma chemical vapor deposition (ICP-CVD), or plasma enhanced chemical vapor deposition (PECVD).

In the step of loading catalyst metals, the catalyst metals may be loaded by at least a pair of roller units using a reel-to-reel method.

In the step of loading catalyst metals, the catalyst metal may be loaded by fixing a surface or an edge of the catalyst metal to a frame.

According to one or more embodiments of the present invention, graphene is synthesized by using the above-stated method.

Surface resistance of the graphene may be smaller than 35 Ohm/sq.

According to one or more embodiments of the present invention, a graphene synthesizing apparatus for manufacturing graphene, the graphene synthesizing apparatus comprises a frame comprising an accommodation space for accommodating catalyst metals extending in a vertical direction or a horizontal direction; and supporting units supporting the catalyst metals, wherein the catalyst metals are apart from each other.

The supporting units may be arranged apart from each other around the catalyst metal.

The supporting units may be coupled to at least one of edges of the catalyst metal.

The supporting units may support a surface of the catalyst metal.

According to one or more embodiments of the present invention, a graphene synthesizing apparatus for manufacturing graphene, the graphene synthesizing apparatus comprises a frame comprising an accommodation space for accommodating catalyst metals extending in a vertical direction or a horizontal direction; and roller units supporting and transferring the catalyst metals, such that the catalyst metals are arranged apart from each other inside the accommodation space.

The roller units may comprise a pair of rollers that are arranged in parallel to each other and arranged around the accommodation space.

A plurality of pairs of rollers may be arranged, and each pair of rollers may be arranged apart from each other in a direction perpendicular to an surface of the catalyst metal.

The pair of rollers may comprise a first roller unit providing the catalyst metal layer; and a second roller unit supporting and transferring the catalyst metal supplied by the first roller unit in a direction.

Advantageous Effects of Invention

According to the one or more of the above embodiments of the present invention, a large quantity of high-quality graphene may be synthesized simply by increasing sizes of grains of catalyst metals.

BRIEF DESCRIPTION OF DRAWINGS

These and/or other aspects will become apparent and more readily appreciated from the following description of the embodiments, taken in conjunction with the accompanying drawings of which.

MODE FOR THE INVENTION

Figure 1:
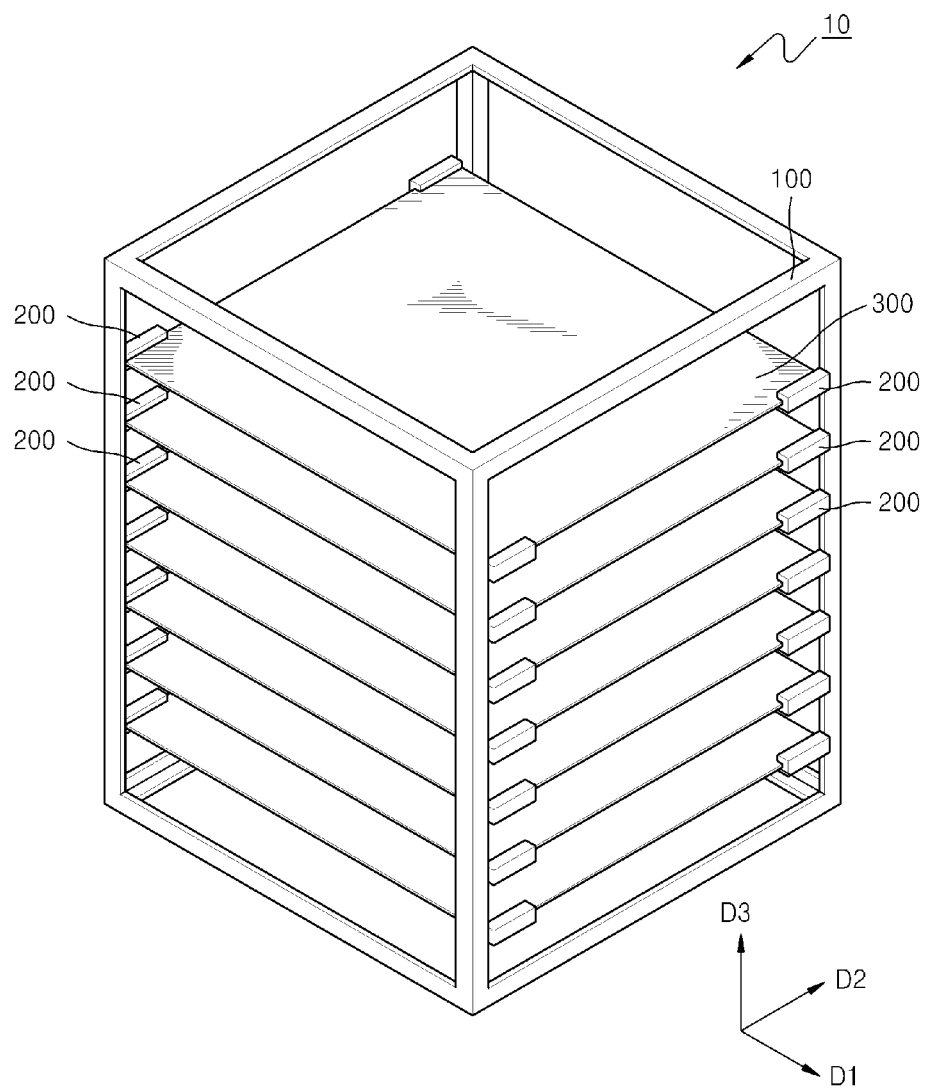
FIG. 1 is a perspective view of a catalyst metal loading device of a graphene synthesizing apparatus according to an embodiment of the present invention.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

The advantages and features of the present invention and methods of achieving the advantages and features will be described more fully with reference to the accompanying drawings, in which exemplary embodiments of the invention are shown. The invention may, however, be embodied in many different forms and should not be construed as being limited to the embodiments set forth herein; rather these embodiments are provided so that this disclosure will be thorough and complete, and will fully convey the concept of the invention to one of ordinary skill in the art. Meanwhile, the terminology used herein is for the purpose of describing particular embodiments only and is not intended to be limiting of exemplary embodiments. As used herein, the singular forms "a", "an", and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof. It will be understood that, although the terms first, second, etc. may be used herein to describe various elements, these elements should not be limited by these terms. These terms are only used to distinguish one element from another.

Hereinafter, the term 'catalyst metal' refers to a catalyst metal used for forming graphene and may be provided as a single metal layer containing a metal only or in combination with other member(s). For example, the catalyst metal may be provided as being arranged on a surface of a substrate such as a silicon wafer containing silicon oxide ($SiO_2$).

Figure 2:
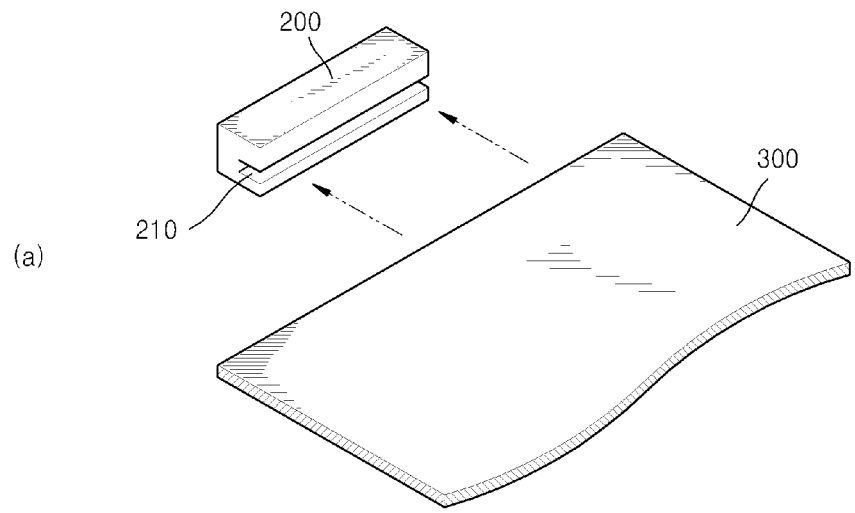
FIGS. 2A and 2B are schematic perspective views showing a combination of a supporting unit and a catalyst metal in the catalyst metal loading device of FIG. 1.
Figure 2:
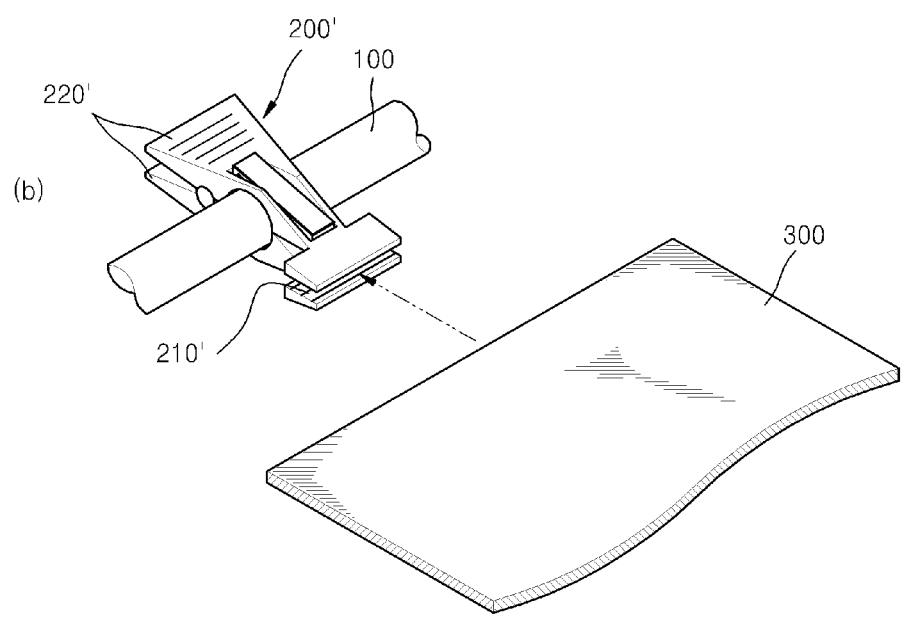

FIG. 1 is a perspective view of a catalyst metal loading device of a graphene synthesizing apparatus according to an embodiment of the present invention. FIGS. 2A and 2B are schematic perspective views showing a combination of a supporting unit and a catalyst metal in the catalyst metal loading device of FIG. 1.

Referring to FIG. 1, the catalyst metal loading device 10 of the graphene synthesizing apparatus includes a frame 100, supporting units 200 which support a catalyst metal 300 loaded to the frame 100.

The frame 100 has a substantially hexahedral shape and six surfaces of the frame 100 may be opened. An accommodation space for accommodating the catalyst metal 300 having a horizontally extending surface is arranged inside the frame 100, and the catalyst metals 300 may be arranged to be a predetermined distance apart from each other in the vertical direction (the direction D3). In this case, the plurality of catalyst metal 300 may be arranged to be parallel to each other.

The catalyst metal 300 has a plate-like shape and a predetermined area and may contain one or more selected from a group consisting of nickel (Ni), cobalt (Co), iron (Fe), platinum (Pt), gold (Au), aluminum (Al), chrome (Cr), copper (Cu), magnesium (Mg), manganese (Mn), molybdenum (Mo), rhodium (Rh), silicon (Si), tantalum (Ta), titanium (Ti), and tungsten (W).

The supporting unit 200 fixes position of the catalyst metal 300 arranged inside the frame 100. A plurality of the supporting units 200 may be arranged apart from each other around the catalyst metal 300 and may support four corners of the catalyst metal 300. For example, if the catalyst metal 300 has a rectangular shape, the supporting units 200 may be arranged around the catalyst metal 300 and fix the catalyst metal 300 by supporting four corners of the catalyst metal 300.

Referring to FIG. 2A, the supporting unit 200 may include a groove 210 to which the catalyst metal 300 may be inserted. The supporting unit 200 and the catalyst metal 300 may be coupled to each other via the groove 210. The groove 210 may be formed to have a depth identical to the thickness of the catalyst metal 300, such that the catalyst metal 300 may be inserted into the groove 210.

Referring to FIG. 2B, the supporting unit 200' may be a clip such that bulldog clip. For example, the catalyst metal 300 may be inserted into a gap 210' formed by pressing a grip 220' of the clip-like supporting unit 200'. The supporting units 200 may has a hole, such that the supporting units 200' may be coupled to the catalyst metal 300 and fixed to the frame 100 at the same time.

Although the supporting unit 200 including the groove 210 and the supporting unit 200 that is a clip are described above with reference to FIGS. 2A and 2B, the present invention is not limited thereto. As long as the catalyst metal 300 may be fixed to the frame 100, any of various shapes and types of supporting units may be employed.

Figure 3:
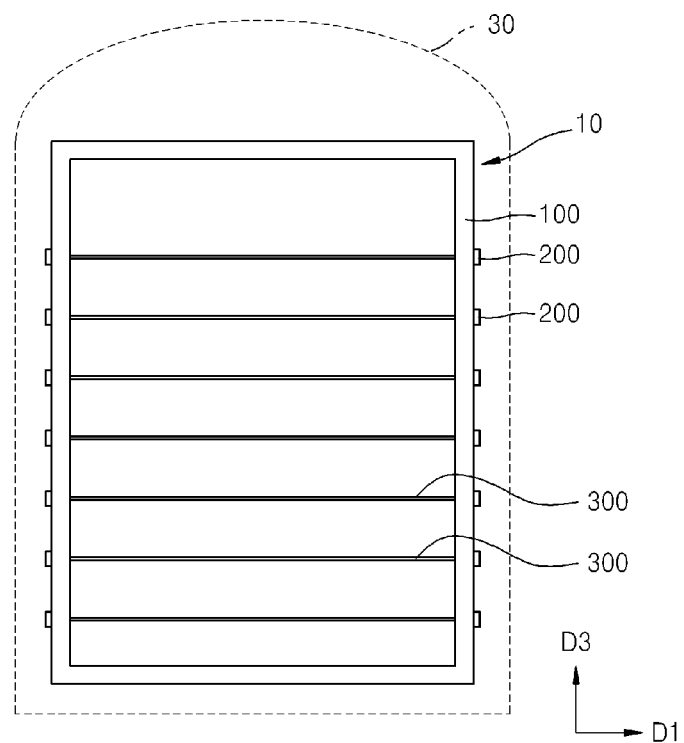
FIG. 3 is a schematic front view of a graphene synthesizing apparatus including the catalyst metal loading device of FIG. 1.

FIG. 3 is a schematic front view of a graphene synthesizing apparatus including the catalyst metal loading device of FIG. 1.

Referring to FIG. 3, the graphene synthesizing apparatus may include a chamber 30 and a catalyst metal loading device 10 arranged inside the chamber 30. The frame 100 accommodating the catalyst metals 300 that are arranged in parallel to each other by the supporting units 200 may be accommodated inside the chamber 30.

Graphene may be synthesized inside the chamber 30 via chemical vapor deposition (CVD) using the catalyst metal 300. Examples of CVDs may include thermal chemical vapor deposition (T-CVD), rapid thermal chemical vapor deposition (RT-CVD), inductive coupled plasma chemical vapor deposition (ICP-CVD), and plasma enhanced chemical vapor deposition (PECVD). Alternatively, atomic layer deposition (ALD) or rapid thermal anneal (RTA) may be employed.

Figure 4:
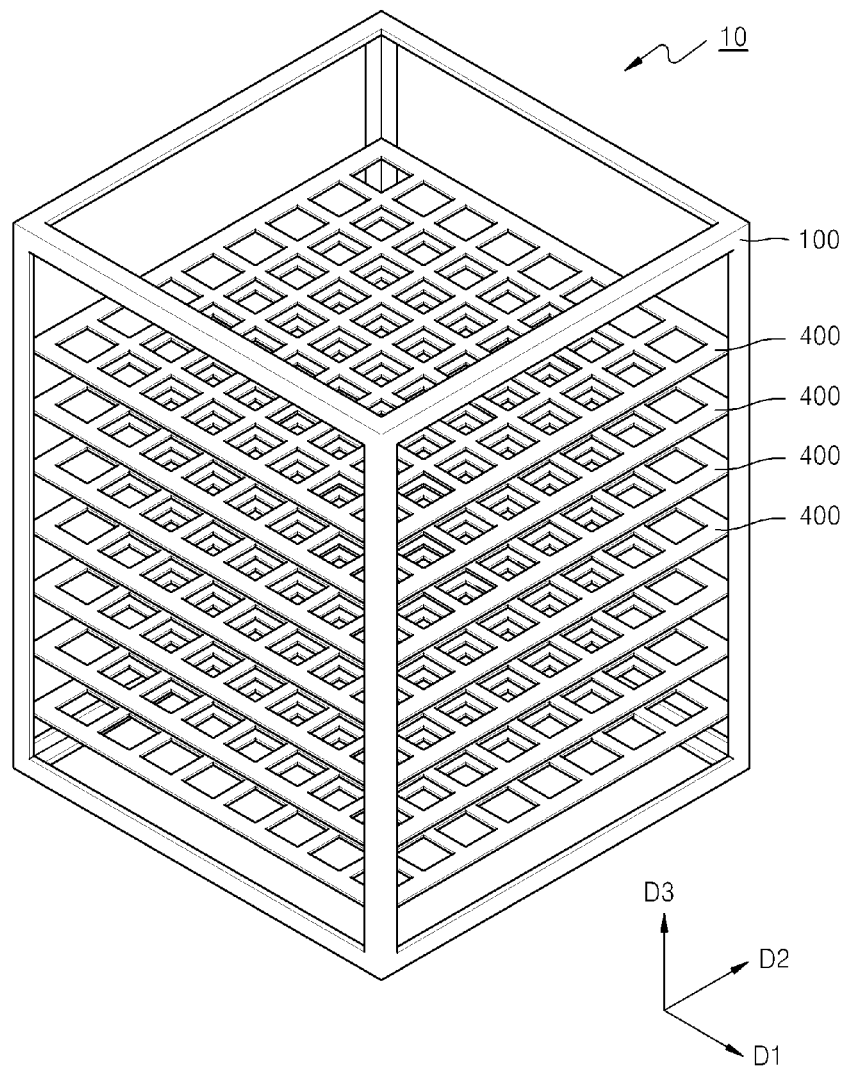
FIG. 4 is a schematic perspective view of a catalyst metal loading device according to another embodiment of the present invention.

FIG. 4 is a schematic perspective view of a catalyst metal loading device according to another embodiment of the present invention. A graphene synthesizing apparatus according to the present embodiment also includes a chamber (not shown) and the catalyst metal loading device 10 arranged inside the chamber. For example, the catalyst metal loading device 10 shown in FIG. 4 may be arranged inside the chamber as shown in FIG. 3.

Referring to FIG. 4, the catalyst metal loading device 10 includes the frame 100 and a supporting unit 400 which supports a catalyst metal loaded onto the frame 100. Furthermore, the frame 100 includes spaces for accommodating a plurality of plate-like catalyst metals. In this regard, the catalyst metal loading device 10 shown in FIG. 4 is similar to the catalyst metal loading device 10 described above with reference to FIGS. 1 through 3.

However, in the present embodiment, the supporting unit 400 is arranged on a surface of a catalyst metal, that is, the bottom surface. As the supporting unit 400 is arranged on the bottom surface of a catalyst metal and supports the catalyst metal overall, the catalyst metal is loaded in the horizontal direction. Furthermore, the supporting unit 400 maintains a distance between a plurality of catalyst metals. The supporting unit 400 may be fixed to the frame 100.

Figure 5:
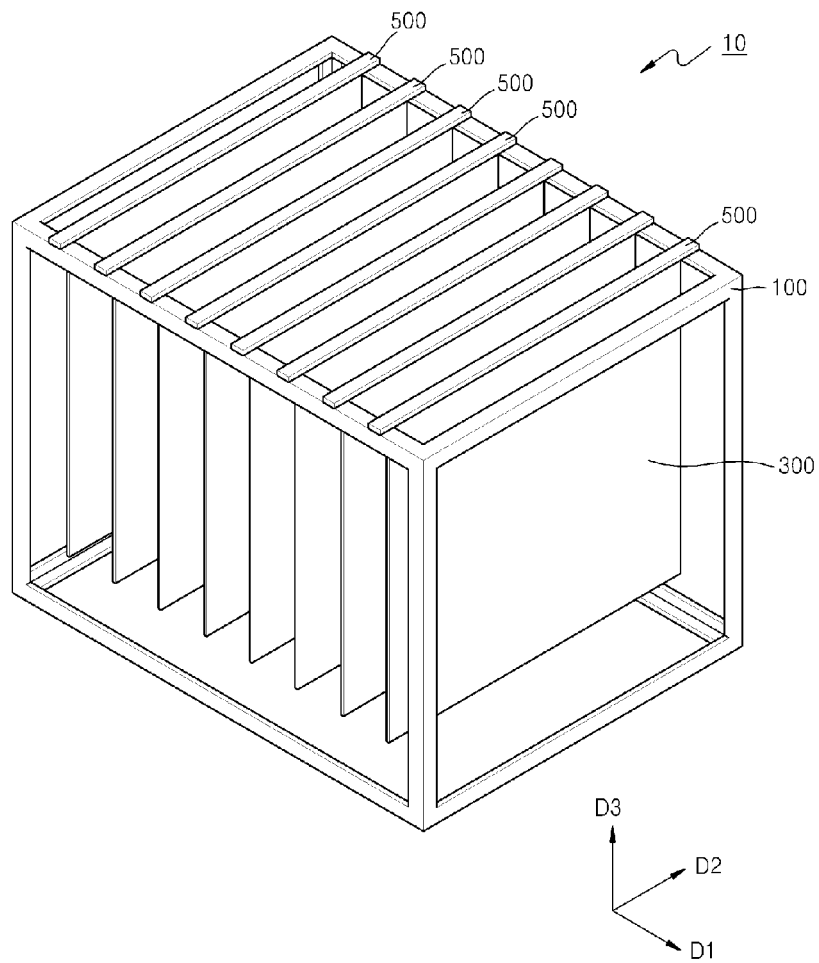
FIG. 5 is a schematic perspective view of a catalyst metal loading device according to another embodiment of the present invention.

FIG. 5 is a schematic perspective view of a catalyst metal loading device according to another embodiment of the present invention.

Referring to FIG. 5, the catalyst metal loading device 10 includes the frame 100 and a supporting unit 500 which supports a catalyst metal loaded to the frame 100. Furthermore, the frame 100 includes spaces for accommodating a plurality of plate-like catalyst metals. In this regard, the catalyst metal loading device 10 shown in FIG. 5 is similar to the catalyst metal loading device 10 described above with reference to FIGS. 1 through 3.

However, in the present embodiment, the catalyst metals 300 have surfaces extending in the vertical direction and are arranged apart from each other in the horizontal direction (the direction D1), and a position of the supporting unit 500 differs from those in the previous embodiments. Descriptions below will focus on the differences therebetween.

The supporting unit 500 may be coupled to an edge of the catalyst metal 300 to fix the position of the catalyst metal 300. Here, the supporting unit 500 is coupled to the upper edge of the catalyst metal 300, such that the catalyst metal 300 is loaded in the vertical direction.

As described above with reference to FIGS. 2A and 2B, the supporting unit 500 may include grooves into which the catalyst metals 300 may be inserted or may be a clip. A plurality of the supporting units 500 may be arranged apart from each other.

Although a case in which the supporting unit 500 is coupled to an entire edge of the catalyst metal 300 is provided in the present embodiment, the present invention is not limited thereto. For example, a plurality of the supporting units 500 may be arranged, and the plurality of supporting units 500 may be arranged apart from each other and are coupled to two opposite upper corners of the catalyst metal 300 to fix the position of the catalyst metal 300.

Figure 6:
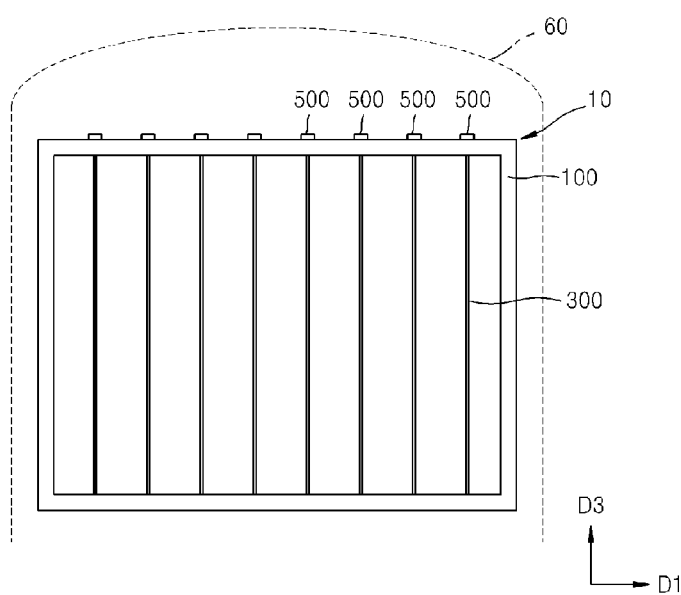
FIG. 6 is a schematic front view of a graphene synthesizing apparatus including the catalyst metal loading device of FIG. 5.

FIG. 6 is a schematic front view of a graphene synthesizing apparatus including the catalyst metal loading device of FIG. 5.

Referring to FIG. 6, the graphene synthesizing apparatus may include a chamber 60 and the catalyst metal loading device 10 arranged inside the chamber 60. The catalyst metal 300 is loaded to the frame in the vertical direction by the supporting unit 500, and the frame 100 to which the plurality of catalyst metals 300 are loaded in parallel to each other may be accommodated inside the chamber 60. Graphene may be fabricated via CVD inside the chamber 60.

Figure 7:
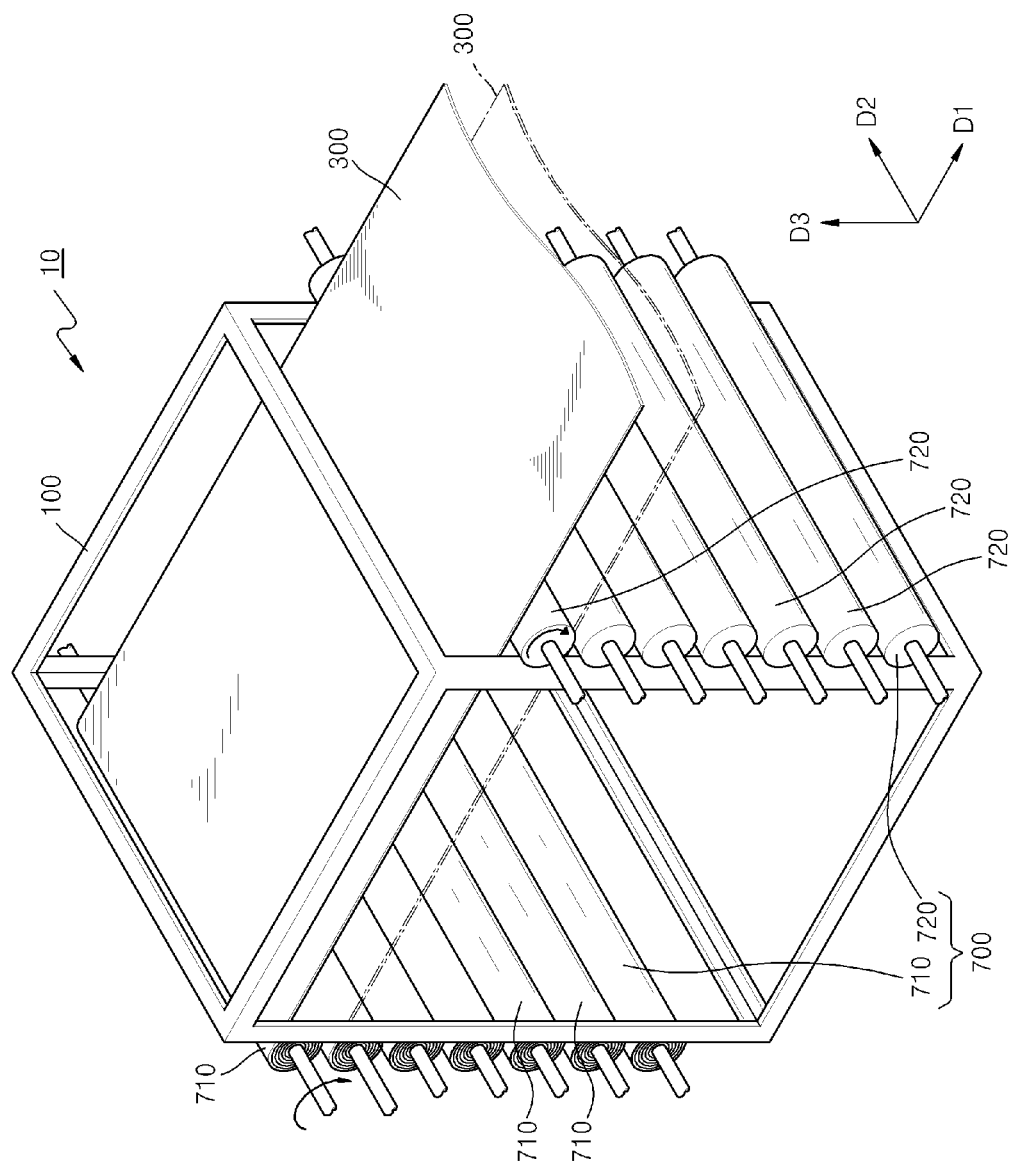
FIG. 7 is a schematic perspective view of a catalyst metal loading device according to another embodiment of the present invention.

FIG. 7 is a schematic perspective view of a catalyst metal loading device according to another embodiment of the present invention.

Referring to FIG. 7, the graphene synthesizing apparatus includes the frame 100 and a roller unit 700 which supports and transfers the catalyst metals 300 loaded to the frame 100.

The frame 100 has a substantially hexahedral shape and six surfaces of the frame 100 may be opened. An accommodation space for accommodating the catalyst metal 300 having a horizontally extending surface is arranged inside the frame 100, and the plurality of catalyst metals 300 may be arranged to be a predetermined distance apart from each other in the vertical direction (the direction D3). In this case, the plurality of catalyst metal 300 may be arranged to be parallel to each other.

The catalyst metal 300 has a plate-like shape and a predetermined area and may contain one or more selected from a group consisting of nickel (Ni), cobalt (Co), iron (Fe), platinum (Pt), gold (Au), aluminum (Al), chrome (Cr), copper (Cu), magnesium (Mg), manganese (Mn), molybdenum (Mo), rhodium (Rh), silicon (Si), tantalum (Ta), titanium (Ti), and tungsten (W).

The roller unit 700 supports and transfers the catalyst metal 300 arranged inside the frame 100. The roller unit 700 includes a pair of roller units 710 and 720. The pair of roller units 710 and 720 are arranged in parallel to each other, such that the catalyst metals 300 may be located therebetween. The first roller unit 710 and the second roller unit 720 may be arranged on outer surfaces of the frame 100 at a same height. For example, the first roller unit 710 is wound with the catalyst metal 300 and rotates in a direction (for example, clockwise or counterclockwise), and the second roller unit 720 rotates in the same direction as the first roller unit 710, and thus the catalyst metal 300 may be transferred in the direction D1.

A plurality of pairs of rollers 710 and 720, each pair of which includes the first roller unit 710 and the second roller unit 720, are arranged apart from each other in the direction D3. The catalyst metals 300 loaded in the horizontal direction may be arranged apart from each other in the vertical direction according to the arrangement of the plurality of pairs of rollers 710 and 720.

Figure 8:
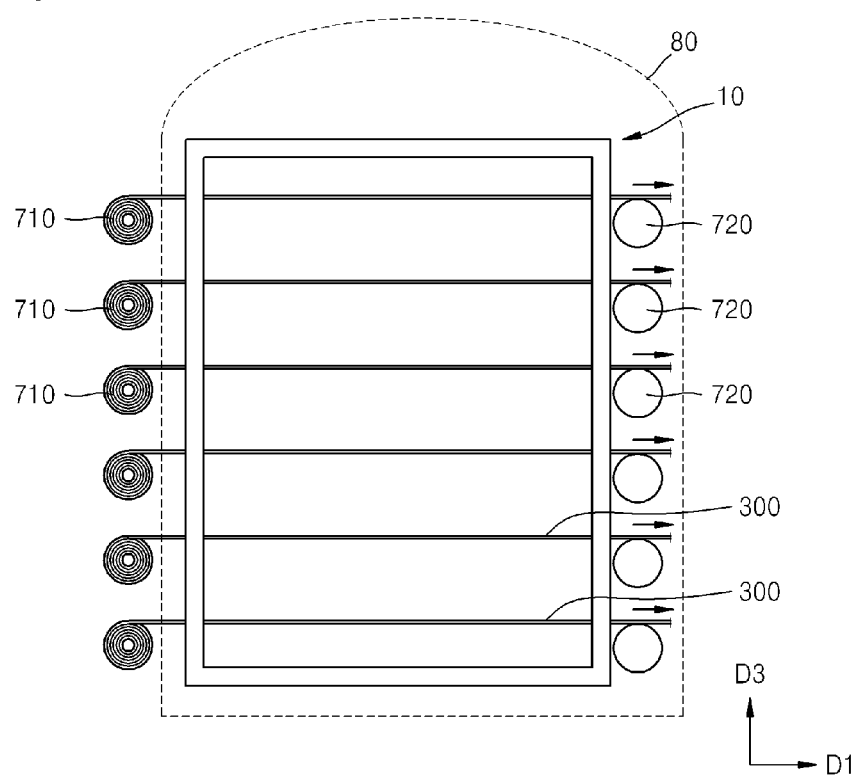
FIG. 8 is a schematic front view of a graphene synthesizing apparatus including the catalyst metal loading device of FIG. 7.

FIG. 8 is a schematic front view of a graphene synthesizing apparatus including the catalyst metal loading device of FIG. 7.

Referring to FIG. 8, the graphene synthesizing apparatus may include a chamber 80 and the catalyst metal loading device 10 arranged inside the chamber 80. The catalyst metals 300 are loaded to the frame 100 in the horizontal direction by the roller units 710 and 720, and the frame 100 to which the plurality of catalyst metal 300 are loaded in parallel to each other may be accommodated inside the chamber 80.

The first roller unit 710, which is wound with the catalyst metal 300, may be arranged outside the chamber 80 and may provide the catalyst metal 300 into the chamber 80. The catalyst metals 300 transferred in the direction D1 by rotating of the first roller unit 710 and the second roller unit 720 may be used for formation/synthesis of graphene inside the chamber 80.

Figure 9:
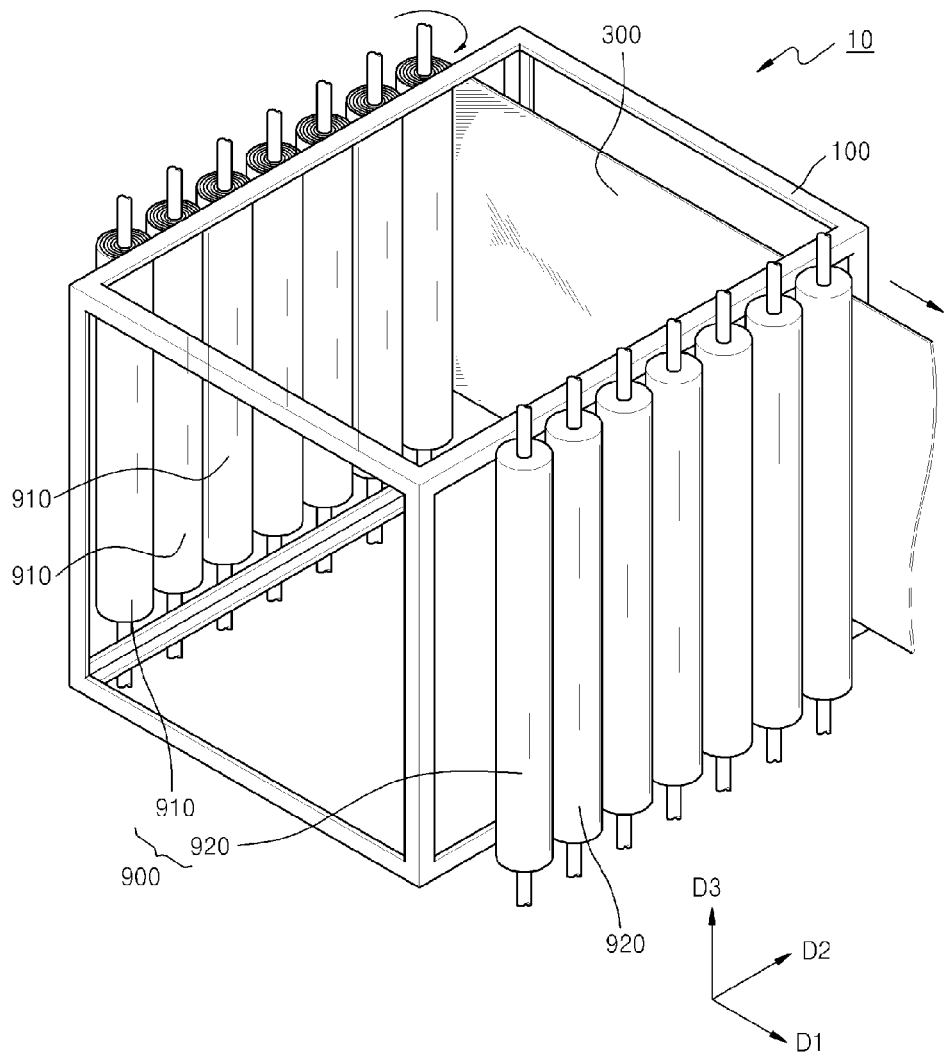
FIG. 9 is a schematic perspective view of a catalyst metal loading device according to an embodiment of the present invention.

FIG. 9 is a schematic perspective view of a catalyst metal loading device according to an embodiment of the present invention.

Referring to FIG. 9, the catalyst metal loading device 10 includes the frame 100 and a roller unit 900 which supports and transfers the catalyst metal 300, where the frame 100 includes a space for accommodating the plurality of catalyst metals 300, like the catalyst metal loading device described above with reference to FIG. 7.

However, in the present embodiment, the catalyst metals 300 have surfaces extending in the vertical direction and are arranged apart from each other in the horizontal direction. The position of the roller unit 900 is different from that of the roller unit 700. Descriptions below will focus on the differences therebetween.

The roller unit 900 includes a pair of roller units 910 and 920. The pair of roller units 910 and 920 are arranged in parallel to each other, such that the accommodation space is located therebetween. The first roller unit 910 and the second roller unit 920 extend in the vertical direction.

The first roller unit 910 and the second roller unit 920 are arranged on outer surfaces of the frame 100. The first roller unit 910 is wound with the catalyst metal 300 and rotates in a direction (clockwise or counterclockwise), and the second roller unit 920 rotates in the same direction as the first roller unit 910 and transfers the catalyst metal 300 in the direction D1.

A plurality of pairs of roller units 910 and 920, each pair of which includes the first roller unit 910 and the second roller unit 920, are arranged apart from each other in the horizontal direction (the direction D2), so that the catalyst metals 300 may be loaded to be apart from each other and in parallel to each other.

In the catalyst metal loading device 10 according to the present embodiment, the first roller unit 910 is arranged outside a chamber (not shown) and provides the catalyst metal 300 into the chamber for the formation of graphene. Although not shown, the catalyst metal loading device 10 may be arranged in the chamber 80 to constitute a graphene synthesizing apparatus.

Figure 10:
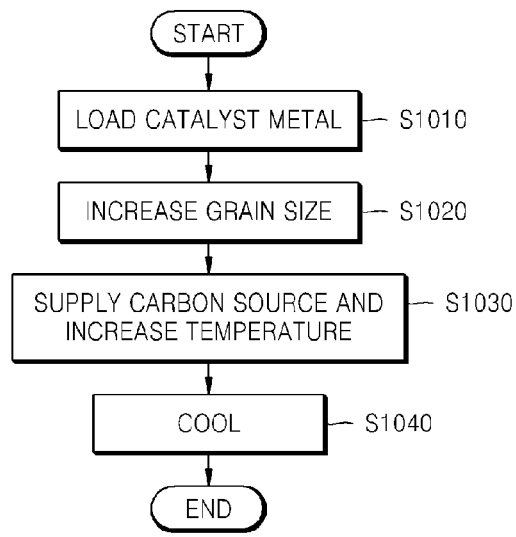
FIG. 10 is a schematic flowchart of a method of synthesizing graphene according to another embodiment of the present invention.

FIG. 10 is a schematic flowchart of a method of synthesizing graphene according to another embodiment of the present invention.

Referring to FIG. 10, in an operation S1010, a catalyst metal is loaded. For example, the catalyst metal may be loaded to the catalyst metal loading device described above with reference to FIGS. 1 and 4 in the horizontal direction. Alternatively, the catalyst metal may be loaded to the catalyst metal loading device described above with reference to FIG. 5. The catalyst metal may be loaded when the catalyst metal is coupled to a supporting unit.

According to another embodiment of the present invention, the catalyst metal may be loaded to the catalyst metal loading device described above with reference to FIG. 7 in the horizontal direction. Alternatively, the catalyst metal may be loaded to the catalyst metal loading device described above with reference to FIG. 9 in the vertical direction. The catalyst metal may be loaded by a pair of roller units using a reel-to-reel method. By using the reel-to-reel method, the catalyst metal may be continuously provided into a chamber.

The catalyst metal may contain one or more selected from a group consisting of nickel (Ni), cobalt (Co), iron (Fe), platinum (Pt), gold (Au), aluminum (Al), chrome (Cr), copper (Cu), magnesium (Mg), manganese (Mn), molybdenum (Mo), rhodium (Rh), silicon (Si), tantalum (Ta), titanium (Ti), and tungsten (W).

If necessary, a pre-processing operation may be performed before the catalyst metal is loaded to the catalyst metal loading device. For example, surfaces of the catalyst metal may be cleaned by using an acidic/alkalic solution.

In an operation S1020, the catalyst metal is heated to increase sizes of grains of the catalyst metal. The catalyst metal may be heated to a temperature about 900° C. or higher, and, as the catalyst metal is heated, sizes of grains of the catalyst metal may be about 100 μm or larger. Here, the term "size of grain" refers to a value measured by a line method. The line method is a method for determining size of grains by counting a number of grains passing through an arbitrary straight line in an electron back scattered diffraction (EBSD) map or a fine tissue image and then dividing the length of the arbitrary straight line by the counted number of grains.

Figure 11:
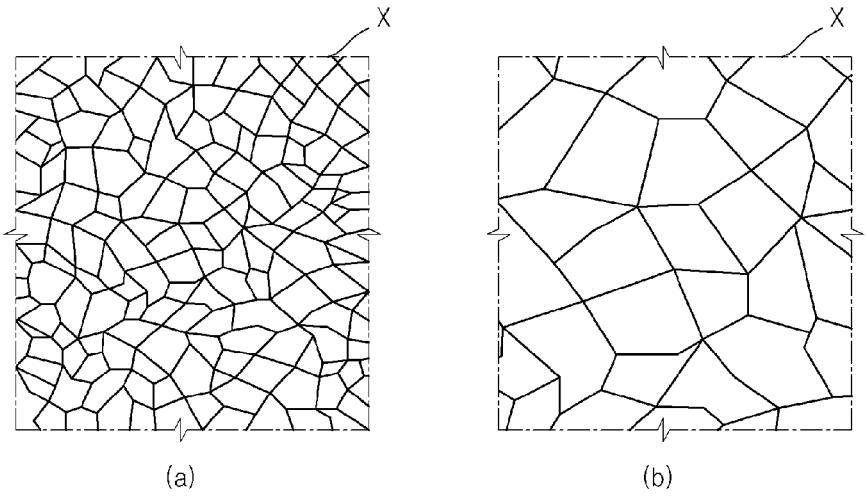
FIGS. 11A and 11B are magnified views of an area X of a catalyst metal to illustrate changing of sizes of grains of the catalyst metal.
Figure 12:
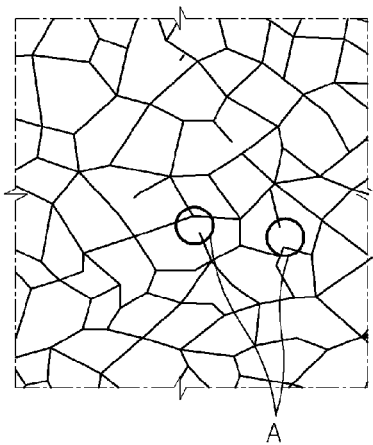
FIG. 12 is a diagram showing that grains adjacent to each other merge with each other while the catalyst metal is being heated

FIGS. 11A and 11B are magnified views of an area X of a catalyst metal to illustrate changing of sizes of grains of the catalyst metal, and FIG. 12 is a diagram showing that grains adjacent to each other merge with each other while the catalyst metal is being heated.

Referring to FIG. 11A, a plurality of grains are densely arranged within a catalyst metal. When the catalyst metal shown in FIG. 11A is heated, a state of the catalyst metal changes to the state shown in FIG. 11B. As the catalyst metal is heated, grains adjacent to each other merge with each other as shown in section A of FIG. 12, and thus sizes of grains increase.

Referring to FIG. 11A showing the state of the catalyst metal before being heated and FIG. 11B showing the state of the catalyst metal after being heated, a number of grains decreases and sizes of grains increases within the same portion X.

In an operation S1030, a gaseous carbon source is injected to the catalyst metal and the temperature inside the chamber is raised.

The operation S1030 may be performed via CVD. For example, thermal chemical vapor deposition (T-CVD), rapid thermal chemical vapor deposition (RT-CVD), inductive coupled plasma chemical vapor deposition (ICP-CVD), or plasma enhanced chemical vapor deposition (PECVD) may be employed.

The gaseous carbon source may be one or more selected from a group of consisting of carbon monoxide, ethane, ethylene, ethanol, acetylene, propane, propylene, butane, butadiene, pentane, cyclopentadiene, hexane, cyclohexane, benzene, and toluene.

For example, as the temperature inside the chamber increases, methane ($CH_4$) gas, which is a gaseous carbon source, is separated to carbon atoms and hydrogen atoms, and the separated carbon atoms are absorbed by surfaces of the catalyst metal. The separated carbon atoms are diffused into grains of the catalyst metal.

In an operation S1040, graphene is formed by cooling the catalyst metal.

As the catalyst metal is cooled, the carbon atoms absorbed by surfaces of the catalyst metal in operation S1030 are synthesized to the surfaces of the catalyst metal, that is to say, graphene is synthesized. The catalyst metal may be cooled within a relatively short period of time. The catalyst metal may be cooled inside the chamber or may be cooled outside the chamber after the catalyst metal is carried out of the chamber after operation S1030.

Next, if required, a carrier member (not shown) may be stacked on graphene, and the catalyst metal may be removed via etching. The carrier member may be polydimethyl-siloxane (PDMS), for example.

Graphene from which the catalyst metal is removed is transferred by the carrier member and may be transferred to a target substrate (not shown). The target substrate may be polyethyleneterephthalate (PET), for example.

Generally, during synthesis of graphene using a catalyst metal, defects may frequently occur, e.g., crystallinity and directivity of graphene may change at boundaries between grains or bonds between carbon atoms constituting graphene may be cut. Crystallinity and directivity of graphene affect movement of electrons. Therefore, if crystallinity and directivity of graphene change, flow of electrons is interfered with, and thus surface resistance of the graphene increases. Flow of electrons is also interfered with by defects occurring around boundaries between grains, and thus surface resistance of the graphene increases.

However, according to embodiments of the present invention, high-quality graphene may be synthesized by increasing sizes of grains of the catalyst metal. As described above with reference to FIGS. 11A and 11B, grains are densely arranged within the predetermined portion X before a catalyst metal is heated. However, after the catalyst metal is heated to increase sizes of grains, a number of grains within the same portion X decreases.

Since sizes of grains increase, an area into which carbon atoms separated in the operation S1030 may be uniformly diffused increases, and thus graphene formed after being cooled in operation S1040 has high quality.

Also, since sizes of grains increase, area occupied by boundaries between grains decreases, and thus problems at the boundaries between grains, e.g., changes of crystallinity and directivity of graphene or other defects as described above, may be minimized.

Figure 13:
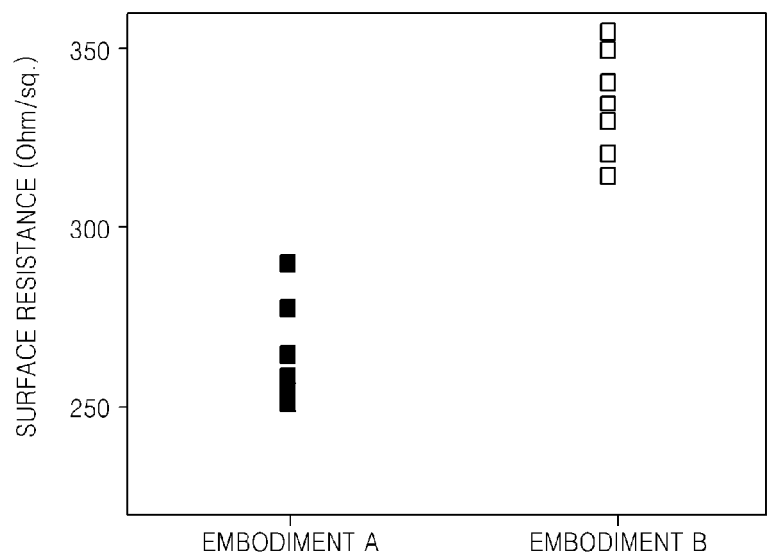
FIG. 13 is a graph showing surface resistance characteristics of graphene synthesized using a method of synthesizing graphene according to an embodiment of the present invention.

FIG. 13 is a graph showing surface resistance characteristics of graphene synthesized using a method of synthesizing graphene according to an embodiment of the present invention.

An embodiment A is an embodiment in which catalyst metal is loaded in the vertical direction, whereas an embodiment B is an embodiment in which catalyst metal is loaded in the horizontal direction.

Referring to FIG. 13, in both the cases where catalyst metals are loaded in the vertical direction (embodiment A) and the horizontal direction (embodiment B), surface resistances are smaller than 35 Ohm/sq. The values are about 20% smaller than the surface resistance of graphene synthesized without performing the operation S1020. The reason for the low surface resistances is that sizes of grains of catalyst metal are increased in operation S1020 as described above.

In particular, the case in which the catalyst metal is loaded in the vertical direction features superior surface resistance characteristics. The reason for this is that, when the catalyst metal is loaded in the vertical direction, grains of the catalyst metal are not only heated in the operation S1020, but are also affected by gravity. In other words, when sizes of grains of the catalyst metal increase as grains adjacent to each other merge with each other, gravity works on the grains, and thus sizes of grains further increase. As a result, an environment for synthesizing high-quality graphene may be provided.

As described above, according to the one or more of the above embodiments of the present invention, a large quantity of high-quality graphene may be synthesized simply by increasing sizes of grains of catalyst metals.

It should be understood that the exemplary embodiments described herein should be considered in a descriptive sense only and not for purposes of limitation. Descriptions of features or aspects within each embodiment should typically be considered as available for other similar features or aspects in other embodiments.

The invention claimed is:

1. A method of synthesizing graphene, the method comprising:
    loading catalyst metals into a chamber in the vertical direction;
    increasing sizes of grains of the catalyst metals by heating the catalyst metals before providing a vapor carbon source in the catalyst metals;
    raising a temperature inside the chamber while providing the vapor carbon source in the catalyst metals; and
    forming graphene by cooling the catalyst metals.

2. The method of claim 1, wherein a size of a grain of the catalyst metal is greater than 100 μm.

3. The method of claim 1, wherein the catalyst metal contains one or more selected from the group consisting of nickel (Ni), cobalt (Co), iron (Fe), platinum (Pt), gold (Au), aluminum (Al), chrome (Cr), copper (Cu), magnesium (Mg), manganese (Mn), molybdenum (Mo), rhodium (Rh), silicon (Si), tantalum (Ta), titanium (Ti), and tungsten (W).

4. The method of claim 1, wherein the step of raising the temperature inside the chamber while providing a vapor carbon source in the catalyst metals comprises thermal chemical vapor deposition (T-CVD), rapid thermal chemical vapor deposition (RT-CVD), inductive coupled plasma chemical vapor deposition (ICP-CVD), or plasma enhanced chemical vapor deposition (PECVD).

5. The method of claim 1, wherein, in the step of loading catalyst metals, the catalyst metals are loaded by at least a pair of roller units using a reel-to-reel method in which the catalyst metals are located between a first roller and a second roller, the first roller is wound with the catalyst metals and rotates in a direction and the second roller rotates in the same direction as the first roller so the catalyst metals are transferred to the direction.

6. The method of claim 1, wherein, in the step of loading catalyst metals, the catalyst metal is loaded by fixing a surface or an edge of the catalyst metal to a frame.

* * * * *